United States Patent
Ding et al.

(10) Patent No.: US 11,355,576 B2
(45) Date of Patent: Jun. 7, 2022

(54) DISPLAY PANEL AND FABRICATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Wu Ding, Hubei (CN); Songshan Li, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 137 days.

(21) Appl. No.: 16/960,103

(22) PCT Filed: Apr. 30, 2020

(86) PCT No.: PCT/CN2020/088280
§ 371 (c)(1),
(2) Date: Jul. 6, 2020

(87) PCT Pub. No.: WO2021/196336
PCT Pub. Date: Oct. 7, 2021

(65) Prior Publication Data
US 2021/0313409 A1    Oct. 7, 2021

(30) Foreign Application Priority Data
Apr. 1, 2020 (CN) .......................... 202010250790.4

(51) Int. Cl.
*H01L 27/32* (2006.01)

(52) U.S. Cl.
CPC .... *H01L 27/3276* (2013.01); *H01L 2227/323* (2013.01)

(58) Field of Classification Search
CPC .................................................. H01L 27/3276
See application file for complete search history.

(56) References Cited

U.S. PATENT DOCUMENTS

2009/0135104 A1    5/2009    Jeong

FOREIGN PATENT DOCUMENTS

| CN | 107068692 A | 8/2017 |
|----|-------------|--------|
| CN | 107123666 A | 9/2017 |
| CN | 209434190 U | 9/2019 |
| CN | 110429116 A | 11/2019 |
| CN | 110796980 A | 2/2020 |
| CN | 110854157 A | 2/2020 |
| KR | 20080000426 A | 1/2008 |

*Primary Examiner* — Douglas M Menz
(74) *Attorney, Agent, or Firm* — The Roy Gross Law Firm, LLC; Roy Gross

(57) ABSTRACT

Provided is a display panel including a substrate layer, an active layer, a first insulating layer, a first metal layer, a second insulating layer, and a second metal layer that are stacked. The second metal layer located in a display area of the display panel comprises a first portion and a second portion, and the second metal layer located in a non-display area of the display panel comprises a third portion, wherein a thickness of the first portion of the second metal layer is less than thicknesses of the second portion and the third portion of the second metal layer.

10 Claims, 4 Drawing Sheets

DISPLAY PANEL AND FABRICATION METHOD THEREOF

FIELD OF INVENTION

The present application relates to a field of display devices, and more particularly to a display panel and a fabrication method thereof.

BACKGROUND

Organic light emitting diode (OLED) devices are more and more widely used due to their advantages of light weight, self-illumination, wide viewing angles, low driving voltages, high luminous efficiency, low power consumption, and fast response times. In particular, flexible OLED display devices have characteristics of being bendable and easy to carry, and have become main fields of research and development in a field of display technology.

TECHNICAL PROBLEM

At present, high-end display devices have higher requirements for brightness uniformity, and how to improve brightness uniformity of a display panel is a key direction for development among major manufacturers.

SUMMARY

One purpose of the present invention is to solve the technical problem that brightness uniformity of the existing display panel cannot meet high requirements.

In some embodiments, the thicknesses of the second portion and third portion of the second metal layer are the same.

In some embodiments, the thickness of the first portion of the second metal layer is a, the thicknesses of the second portion and the third portion of the second metal layer are b, and $2a \leq b \leq 3a$.

In some embodiments, the second metal layer located in the display area further comprises a fourth portion for electrically connecting an anode layer of an organic light emitting diode and a fifth portion for signal line switching, wherein thicknesses of the fourth portion and the fifth portion of the second metal layer are the same as the thickness of the first portion.

In some embodiments, the thicknesses of the fourth portion and the fifth portion of the second metal layer are the same as the thickness of the first portion of the second metal layer.

In some embodiments, materials of the first portion and the second portion of the second metal layer comprise aluminum or aluminum alloy.

The present application further provides a fabrication method of a display panel, wherein the display panel is defined with a display area and a non-display area, comprising following steps: providing a structure comprising a substrate layer, an active layer, a first insulating layer, a first metal layer, and a second insulating layer that are stacked; and forming a second metal layer on the second insulating layer, wherein the second metal layer located in the display area comprises a first portion for a data signal line and a second portion for a driving power line for connecting a positive voltage (VDD), and the second metal layer located in the non-display area comprises a third portion of a driving power line for connecting a negative voltage (VSS), wherein a thickness of the first portion of the second metal layer is less than thicknesses of the second portion and the third portion of the second metal layer.

In some embodiments, the thicknesses of the second portion and third portion of the second metal layer are the same, and the thickness of the first portion of the second metal layer is a, the thicknesses of the second portion and the third portion of the second metal layer are b, and $2a \leq b \leq 3a$.

In some embodiments, forming the second metal layer on the second insulating layer comprises following steps: forming a second metal layer and coating photoresist, sequentially covering the second insulating layer; exposing and developing the photoresist by using a mask having multiple transmittances, forming first and second portions of a photoresist pattern in the display area and a third portion of the photoresist pattern in the non-display area, and thicknesses of the second and third portions of the photoresist pattern are thicker than a thickness of the first portion of the photoresist pattern; and performing an etching process to etch the second metal layer by using the first, second, and third portions of the photoresist pattern as an etching mask, and followed by an ashing process to leave the first and second portions of the second metal layer located in the display area and the third portion of the second metal layer located in the non-display area on the second insulating layer.

In some embodiments, the mask having multiple transmittances comprises a first transmittance area, a second transmittance area, and a third transmittance area, wherein a light transmittance of the first transmittance area is less than a light transmittance of the second transmittance area, and the light transmittance of the second transmittance area is less than a light transmittance of the third transmittance area rate.

ADVANTAGEOUS EFFECTS

In the display panel and the fabrication method thereof provided by the embodiments of the present application, a mask having multiple transmittances is used in conjunction with a photolithography process to increase thicknesses of the second metal layer of a vertical signal line for forming a driving power line for providing positive voltage (VDD) in a display area and the second metal layer in the non-display area for forming a driving power line for providing negative voltage (VSS), and make thereof larger than a thickness of the second metal layer of a data signal line connected in the display area as a source/drain layer, thereby reducing a voltage drop of the signal lines such as driving power lines of the positive voltage (VDD) and the negative voltage (VSS), and thus increasing brightness uniformity of the display panel and improving image quality of the display panel.

BRIEF DESCRIPTION OF DRAWINGS

To detailly explain the technical schemes of the embodiments or existing techniques, drawings that are used to illustrate the embodiments or existing techniques are provided. Obviously, the illustrated embodiments are just a part of those of the present disclosure. It is easy for any person having ordinary skill in the art to obtain other drawings without labor for inventiveness.

DETAILED DESCRIPTION

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

The terms "first", "second", "third", etc. (if any) in the description and claims of the present invention and the above drawings are used to distinguish similar objects, and are not required to describe a specific order or in order. It should be understood that the objects so described are interchangeable under appropriate circumstances. In addition, the terms "including" and "having" and any variations thereof are intended to cover non-exclusive inclusions.

Figure 1:
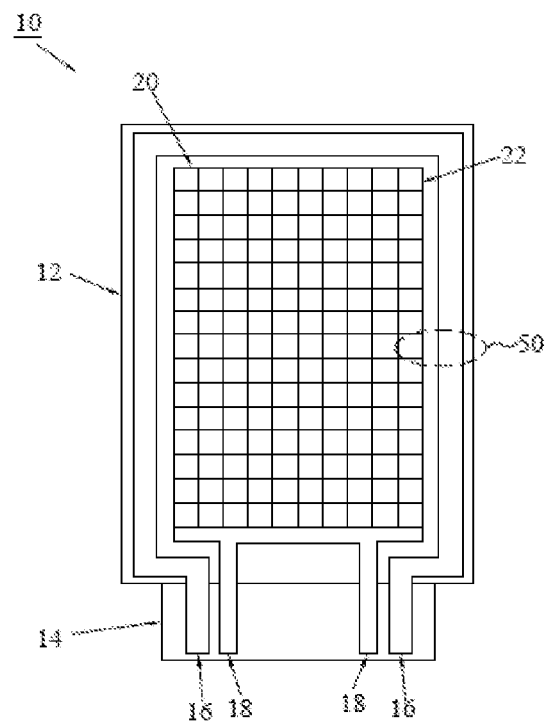
FIG. 1 is a schematic diagram of a signal line layout of a display panel according to an embodiment of the invention.

An embodiment of the present invention provides a display panel 10, and FIG. 1 shows a schematic diagram of a signal line layout of the display panel 10. The display panel 10 is, for example, an active-matrix organic light emitting diode (AMOLED) display panel. The display panel 10 comprises a driving power line 16 that provides a negative voltage (VSS), a driving power line 18 that provides a positive voltage (VDD), and a plurality of horizontal signal lines 20 and a plurality of vertical signal lines 22 that are routed in a grid and constitute an active matrix. The plurality of horizontal signal lines 20 and the plurality of vertical signal lines 22 are formed in the display device area 12, and the plurality of horizontal signal lines 20 are, for example, scanning signal lines. The plurality of vertical signal lines 22 are, for example, a data signal line and a driving power line of a positive voltage (VDD). The driving power line 16 is introduced from a packaging area 14 and routed along a periphery of the display device area 12 to introduce an entire signal of a cathode signal to the cathode (not shown). The driving power line 18 is introduced into the display device area 12 from the packaging area 14 and is electrically connected to the plurality of horizontal signal lines 20 and the plurality of vertical signal lines 22.

Figure 2:
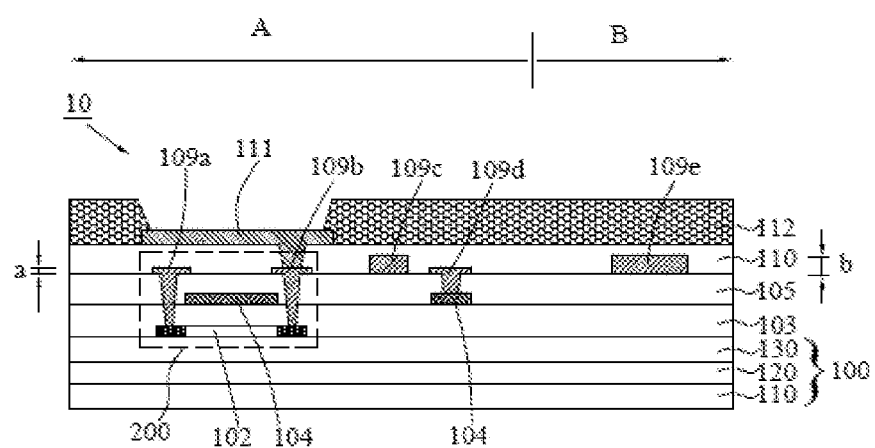
FIG. 2 is a schematic cross-sectional view of an area 50 in FIG. 1.
Figure 3:
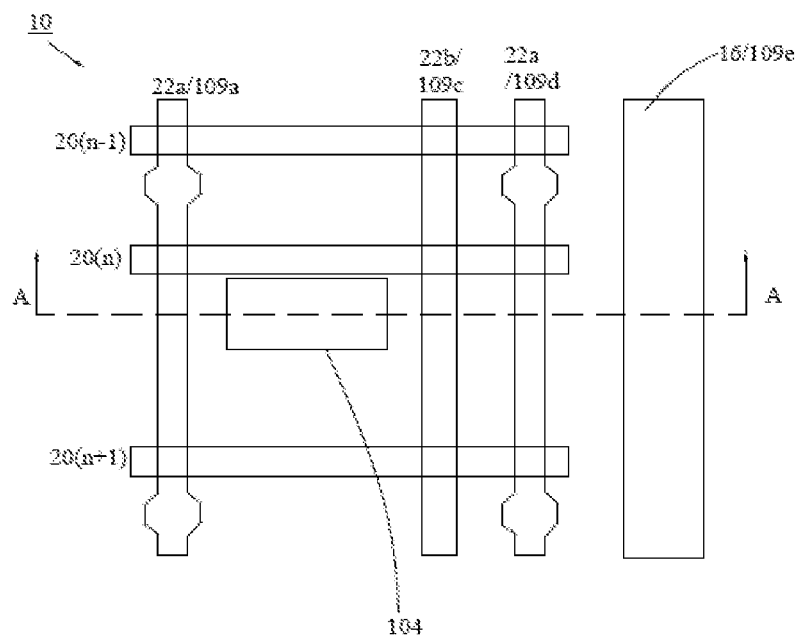
FIG. 3 is a schematic top view of the structure shown in FIG. 2.

Please refer to FIGS. 2-3, which show a schematic diagram of an area 50 at the junction of a display area A and a non-display area B of the display device area 12 in the display panel 10 of FIG. 1, wherein FIG. 2 is a schematic cross-sectional view of the area 50 in FIG. 1, and FIG. 3 is a schematic top view of the structure shown in FIG. 2.

Referring to FIG. 2, the display panel 10 comprises a substrate layer 100, an active layer 102, a first insulating layer 103, a first metal layer 104, a second insulating layer 105, second metal layers 109a, 109b, 109c, 109d, and 109e, a planarization layer 110, an anode layer 111, and a pixel definition layer 112 which are stacked. The substrate layer 100 comprises a substrate 110, a barrier layer 120, and a buffer layer 130 that are sequentially stacked. The substrate 110 may be a rigid substrate or a flexible substrate, and is made of an appropriate material. Characteristics of the substrate 110 and the materials thereof are not described and limited herein.

The barrier layer 120 is disposed on the substrate 110, and the buffer layer 130 is disposed on the barrier layer 120. The active layer 102 is disposed on the buffer layer 130, and the first insulating layer 103 is disposed on the active layer 102. The first metal layer 104 is disposed on the first insulating layer 103, and the second insulating layer 105 is disposed on the first metal layer 104. The second metal layers 109a, 109b, 109c, 109d, and 109e are disposed on the second insulating layer 105, and the planarization layer 110 is disposed on the second metal layers 109a, 109b, 109c, 109d, and 109e. The anode layer 111 is disposed on the planarization layer 110, and the pixel definition layer 112 is disposed on the anode layer 111.

As shown in FIG. 2, the display area A and the non-display area B are defined on the display panel 100 along a horizontal direction. The first metal layer 104 in the display area A is a gate layer for connecting a scanning signal line 20 (see FIG. 3), and the second metal layers 109a and 109b are source/drain layers. The second metal layer 109a is connected to the data signal line 22 (see FIG. 3), and the second metal layer 109b also functions as an anode signal layer for electrically connecting the anode layer 111 which is formed later. In addition, the second metal layer 109c is a driving power line for connecting a positive voltage (VDD) of the driving power line 18 to provide driving power for each pixel.

Referring to FIG. 2, through suitable designs, thicknesses of the second metal layers 109a, 109b, 109c, 109d, and 109e in the display area A and the non-display area B in this embodiment are different. Preferably, the second metal layers 109a, 109b, and 109d in the display area A have a same thickness a, and the second metal layer 109c in the display area A and the second metal layer 109e in the non-display area B have a same thickness b. The thickness b of the second metal layers 109c and 109e is greater than the thickness a of the second metal layers 109a, 109b, and 109d, and there is a relationship of $2a \leq b \leq 3a$ existing between the thicknesses a and b. In this way, by increasing the thickness of the second metal layer 109c in the display area A and the second metal layer 109e in the non-display area B to the thickness b, resistances of the vertical signal line 22 (refer to FIG. 3) formed by the second metal layer 109 for functioning as a driving power line to provide a positive voltage (VDD) and the driving power line 16 (refer to FIG. 3) formed by the second metal layer 109d for providing a negative voltage (VSS) in the display area A can be greatly reduced, thereby reducing voltage drops of signal lines and improving brightness uniformity of the display panel, thus improving image quality of the display panel 10.

In the present embodiment, materials of the first metal layer 104 and the second metal layers 109a, 109b, 109c, 109d, and 109e comprise aluminum or aluminum alloy. The present invention can use aluminum or aluminum alloy for forming metal traces (referring to the first metal layer 104 and the second metal layers 109a, 109b, 109c, 109d, and 109e), which helps to improve the electrical conductivity of the metal traces and further reduce the risk of voltage drop thereof.

As shown in FIGS. 2-3, an embodiment of the present invention provides a display panel 100 comprising a substrate layer 100, an active layer 102, a first insulating layer 103, a first metal layer 104, a second insulating layer 105, and a second metal layer 109 that are stacked. The display panel 10 is defined with a display area A and a non-display area B. The second metal layer 109 located in the display area A comprises a first portion (for example, the second metal layer 109a) functioning as a data signal line, and a second portion (for example, the second metal layer 109c) for functioning as a driving power line for connecting a positive voltage (VDD), and the second metal layer located in the non-display area B comprises a third portion (for example, the second metal layer 109e) functioning as a driving power line for connecting a negative voltage (VSS), wherein a thickness of the first portion of the second metal layer is less than thicknesses of the second portion and the third portion of the second metal layer.

Figure 4:
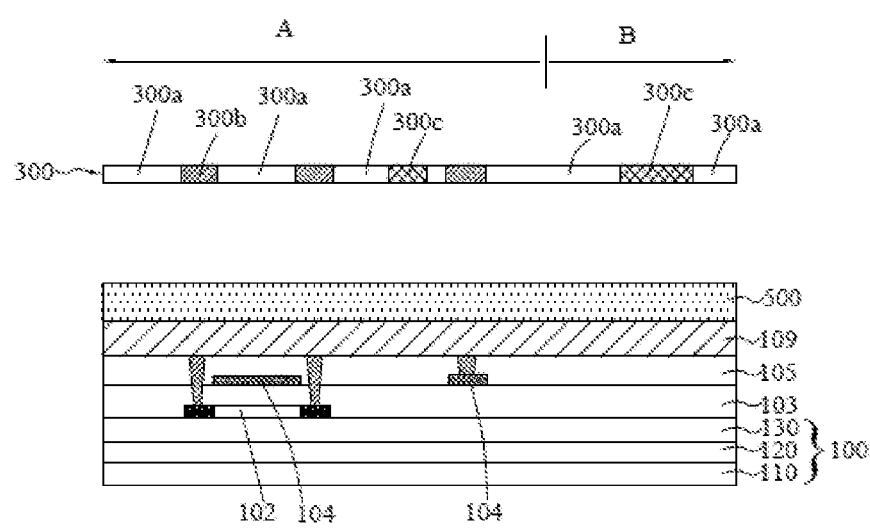
FIGS. 4 to 7 are schematic cross-sectional views of a fabrication method of a display panel according to an embodiment of the invention.

During specific implementation, please refer to FIG. 4 to FIG. 7, an embodiment of the present invention provides a fabrication method of the display panel 10, which specifically comprises following steps:

Referring to FIG. 4, a starting structure comprising a substrate layer 100, an active layer 102, a first insulating layer 103, a first metal layer 104, and a second insulating layer 105 that are stacked is provided. The substrate layer 100 comprises a substrate 110, a barrier layer 120, and a buffer layer 130 that are sequentially stacked. The substrate 110 may be a rigid substrate or a flexible substrate, and is made of an appropriate material. The characteristics of the substrate 110 and the materials used are not described and limited herein.

Figure 5:
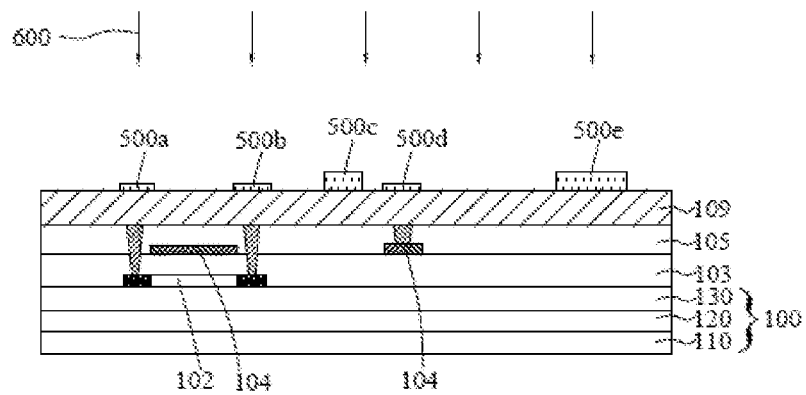

Next, a second metal layer 109 is formed and a photoresist 500 is coated to cover the second insulating layer 105 in sequence. The material of the second metal layer 109 comprises aluminum or aluminum alloy, and the material of the photoresist 500 includes a positive photoresist material. Then, the photoresist 500 is exposed with a mask 300 having multiple transmittances, and the photoresist 500 is formed with a plurality of spaced photoresist patterns 500a, 500b, 500c, 500d, and 500e after development thereof, as shown in FIG. 5. The plurality of photoresist patterns 500a, 500b, 500c, and 500d are disposed in the display area A, and the photoresist pattern 500e is located in the non-display area B. Here, thicknesses of the photoresist patterns 500c and 500e are thicker than thicknesses of the photoresist patterns 500a, 500b, and 500d.

Referring to FIGS. 4-5, the mask 300 with multiple transmittances comprises a plurality of first transmittance areas 300c, a plurality of second transmittance areas 300b, and a plurality of third transmittance areas 300a, The plurality of first transmittance areas 300c correspond to the photoresist patterns 500c and 500e, and the plurality of second transmittance areas 300b correspond to the photoresist patterns 500a, 500b, and 500d. A light transmittance of the plurality of first transmittance areas 300c is less than a light transmittance of the plurality of second transmittance areas 300b, and the light transmittance of the plurality of second transmittance areas 300b is less than a light transmittance of the plurality of third transmittance areas 300a. Furthermore, the plurality of first transmittance areas 300c are unexposed areas, the plurality of second transmittance areas 300b are partially exposed areas, and the plurality of third transmittance areas 300a are fully exposed areas.

Figure 6:
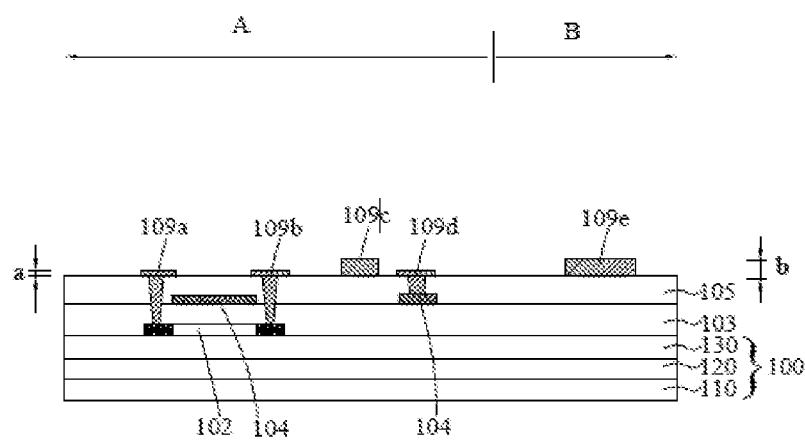

Next, performing an etching process 600 by using the photoresist patterns 500a, 500b, 500c, and 500d formed on the second metal layer 109 as an etching mask, the second metal layer 109 is etched and then the photoresist patterns 500a, 500b, 500c, 500d, and 500e are subjected to an ashing process (not shown), thereby leaving a plurality of patterned second metal layers 109a, 109b, 109c, 109d, and 109e disposed in the display area A and the non-display area B on the second insulating layer 105, which respectively correspond to one of the photoresist patterns 500a, 500b, 500c, 500d, and 500e, as shown in FIG. 6. Since there is a difference existing in thicknesses between the plurality of photoresist patterns 500a, 500b, 500c, 500d, and 500e, after the etching process 600 is performed, the metal layers 109a, 109b, 109c, 109d, and 109e disposed in the display area A and the non-display area B have different thicknesses. As described above, the second metal layers 109a, 109b, and 109d in the display area A have the same thickness a, while the second metal layer 109c in the display area A and the second metal layer 109e in the non-display area B have the same thickness b. The thickness b of the second metal layers 109c and 109e is greater than the thickness a of the second metal layers 109a, 109b, and 109d, and there is a relationship of 2a≤b≤3a between the thicknesses a and b.

Figure 7:
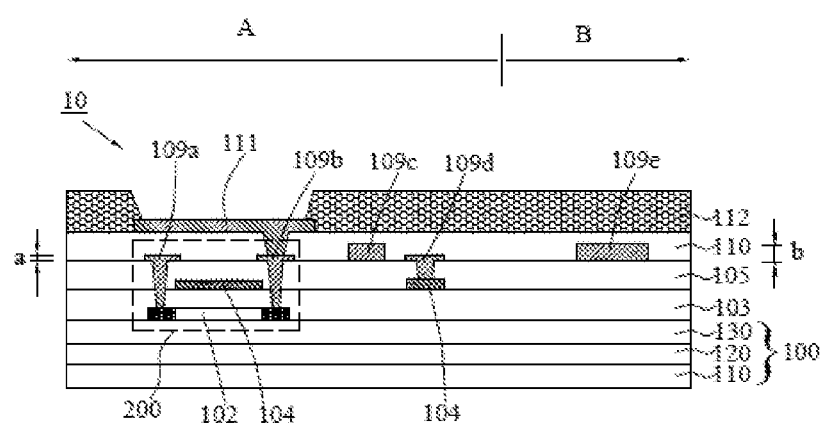

Referring to FIG. 7, a planarization layer 100 is formed, and the planarization layer 110 is formed on the second metal layers 109a, 109b, 109c, 109d, and 109e. Next, an anode layer 111 is formed, the anode layer 111 is formed on the planarization layer 110 and patterned, and the anode layer 111 is electrically connected to the second metal layer 109b. Next, a pixel definition layer 112 is formed, and the pixel definition layer 112 is formed on the anode layer 111 and patterned, and the anode layer 111 is exposed to form a pixel defining groove.

In this embodiment, by using the mask 300 with multiple transmittances and the photolithography process, thicknesses of the second metal layers 109a, 109b, 109c, 109d, and 109e are different. Preferably, the second metal layers 109a, 109b, and 109d in the display area A have the same thickness a, and the second metal layer 109c in the display area A and the second metal layer 109e in the non-display area B have the same thickness b. The thickness b of the second metal layers 109c and 109e is greater than the thickness a of the second metal layers 109a, 109b, and 109d, and there is a relationship of 2a≤b≤3a between the thicknesses a and b. In this way, by increasing thicknesses of the second metal layer 109c in the display area A and the second metal layer 109e in the non-display area B to the thickness b, resistances of the vertical signal line 22 (refer to FIG. 3) formed by the second metal layer 109 for functioning as a driving power line to provide a positive voltage (VDD) and the driving power line 16 (refer to FIG. 3) formed by the second metal layer 109d for providing a negative voltage (VSS) in the display area A can be greatly reduced, thereby reducing voltage drops of signal lines and improving brightness uniformity of the display panel, thus improving image quality of the display panel 10.

As shown in FIGS. 4-7, the display panel 10 is defined with a display area A and a non-display area B, and the fabricating method of the display panel 10 comprises steps:

providing a structure comprising a substrate layer 100, an active layer 102, a first insulating layer 103, a first metal layer 104, and a second insulating layer 105 that are stacked; and forming a second metal layer 109 on the second insulating layer, wherein the second metal layer located in the display area comprises a first portion (for example, the second metal layer 109a) for a data signal line and a second portion (for example, the second metal layer 109c) for a driving power line for connecting a positive voltage (VDD), and the second metal layer located in the non-display area comprises a third portion (for example, the second metal layer 109e) of a driving power line for connecting a negative voltage (VSS), wherein a thickness of the first portion of the second metal layer is less than thicknesses of the second portion and the third portion of the second metal layer.

The display substrate 100 described above can be used for any display device or component with a display function such as a wearable device, a mobile phone, a tablet computer, a television, a display, a notebook computer, an e-book, an electronic newspaper, a digital photo frame, a navigator, and the like. Wearable devices include smart bracelets, smart watches, virtual reality (VR), and other devices.

A display panel and a fabrication method thereof provided by the embodiments of the present application have been described in detail above, and specific examples have been used to explain the principles and implementations of the present application. The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. A display panel, comprising a substrate layer, an active layer, a first insulating layer, a first metal layer, a second insulating layer, and a second metal layer that are stacked, wherein:
the display panel is defined with a display area and a non-display area, the second metal layer located in the display area comprises a first portion functioning as a data signal line and a second portion functioning as a driving power line for connecting a positive voltage (VDD), and the second metal layer located in the non-display area comprises a third portion functioning as a driving power line for connecting a negative voltage (VSS), wherein a thickness of the first portion of the second metal layer is less than thicknesses of the second portion and the third portion of the second metal layer.

2. The display panel of claim 1, wherein the thicknesses of the second portion and third portion of the second metal layer are same.

3. The display panel of claim 2, wherein the thickness of the first portion of the second metal layer is a, the thicknesses of the second portion and the third portion of the second metal layer are b, and $2a \leq b \leq 3a$.

4. The display panel of claim 1, wherein the second metal layer located in the display area further comprises a fourth portion for electrically connecting an anode layer of an organic light emitting diode and a fifth portion for signal line switching, wherein thicknesses of the fourth portion and the fifth portion of the second metal layer are same as the thickness of the first portion.

5. The display panel of claim 4, wherein the thicknesses of the fourth portion and the fifth portion of the second metal layer are the same as the thickness of the first portion of the second metal layer.

6. The display panel of claim 1, wherein materials of the first portion and the second portion of the second metal layer comprise aluminum or aluminum alloy.

7. A fabrication method of a display panel, wherein the display panel is defined with a display area and a non-display area, comprising following steps:
providing a structure comprising a substrate layer, an active layer, a first insulating layer, a first metal layer, and a second insulating layer that are stacked; and
forming a second metal layer on the second insulating layer, wherein the second metal layer located in the display area comprises a first portion functioning as a data signal line and a second portion functioning as a driving power line for connecting a positive voltage (VDD), and the second metal layer located in the non-display area comprises a third portion functioning as a driving power line for connecting a negative voltage (VSS), wherein a thickness of the first portion of the second metal layer is less than thicknesses of the second portion and the third portion of the second metal layer.

8. The fabrication method according to claim 7, wherein the thicknesses of the second portion and third portion of the second metal layer are same, and the thickness of the first portion of the second metal layer is a, the thicknesses of the second portion and the third portion of the second metal layer are b, and $2a \leq b \leq 3a$.

9. The fabrication method according to claim 7, wherein forming the second metal layer on the second insulating layer comprises following steps:
forming the second metal layer and coating photoresist, sequentially covering the second insulating layer;
exposing and developing the photoresist by using a mask having multiple transmittances, forming first and second portions of a photoresist pattern in the display area and a third portion of the photoresist pattern in the non-display area, wherein thicknesses of the second and third portions of the photoresist pattern are thicker than a thickness of the first portion of the photoresist pattern; and
performing an etching process to etch the second metal layer by using the first, second, and third portions of the photoresist pattern as an etching mask, and followed by an ashing process to leave the first and second portions of the second metal layer located in the display area and the third portion of the second metal layer located in the non-display area on the second insulating layer.

10. The fabrication method according to claim 7, wherein the mask having multiple transmittances comprises a first transmittance area, a second transmittance area, and a third transmittance area, wherein a light transmittance of the first transmittance area is less than a light transmittance of the second transmittance area, and the light transmittance of the second transmittance area is less than a light transmittance of the third transmittance area rate.

* * * * *